United States Patent [19]
Higashida

[11] Patent Number: 6,006,023
[45] Date of Patent: Dec. 21, 1999

[54] METHOD OF OPTIMIZING A LOGIC CIRCUIT

[75] Inventor: Motoki Higashida, Tokyo, Japan

[73] Assignee: Mitsubishi Denki Kabushiki Kaisha, Tokyo, Japan

[21] Appl. No.: 08/744,832

[22] Filed: Nov. 6, 1996

[30] Foreign Application Priority Data

May 21, 1996 [JP] Japan .................................... 8-125495

[51] Int. Cl.$^6$ ...................................................... G06F 15/00
[52] U.S. Cl. ...................... 395/500.07; 327/292; 709/204
[58] Field of Search ........................... 307/443; 364/489; 395/500; 327/292; 709/204

[56] References Cited

FOREIGN PATENT DOCUMENTS 3-24763 2/1991 Japan .
5-152438 6/1993 Japan .

OTHER PUBLICATIONS

30$^{th}$ ACM/IEEE Design Automation Conference, 230–235, Hirendu Vaishnav, et al., "Routability–Driven Fanout Optimization".

Primary Examiner—Kevin J. Teska
Assistant Examiner—Thuan Do
Attorney, Agent, or Firm—Oblon, Spivak, McClelland, Maier & Neustadt, P.C.

[57] ABSTRACT

Buffer trees are detected in an inputted logic circuit and sets of driver gates included in the respective buffer trees are made (in Step 102). A set of gates relating to more than one buffer tree, i.e., a group of gates to be optimized, is detected (in Step 103). The groups of gates to be optimized are classified according to the symmetry in logic structure (in Step 104). Each group of gates to be optimized is extracted (in Step 105). The buffer trees are restructured so as to be in a symmetrical relation with each other (In Step 106). Through the above process, the buffer trees are optimized to be in a symmetrical relation of logic structure. Thus, the method of optimizing the logic circuit to ensure reduction in routing area, total length of interconnections and delay of the layout after placement is accomplished.

18 Claims, 11 Drawing Sheets

F I G. 9
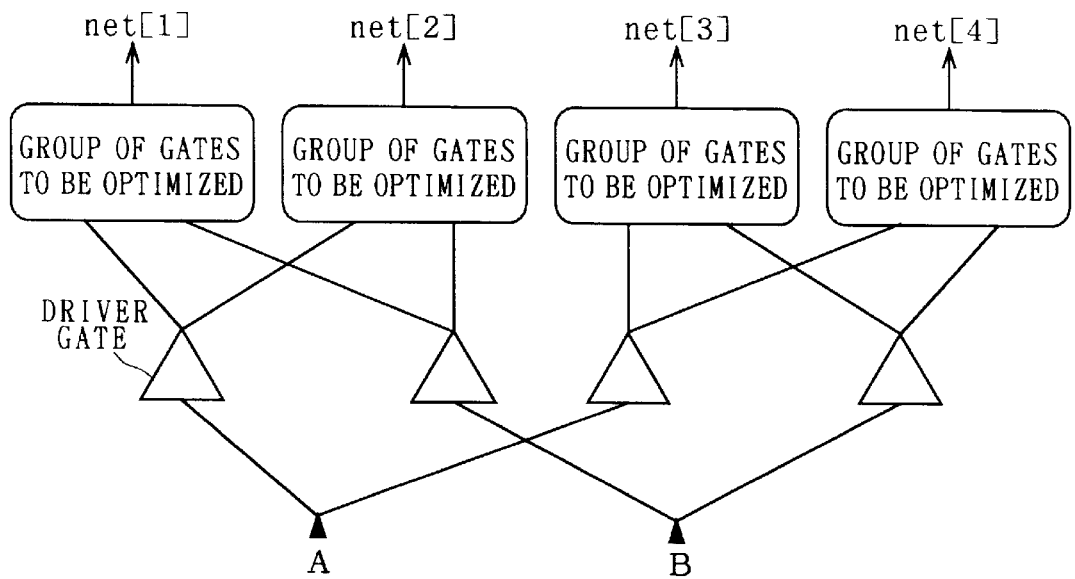
F I G. 1 0
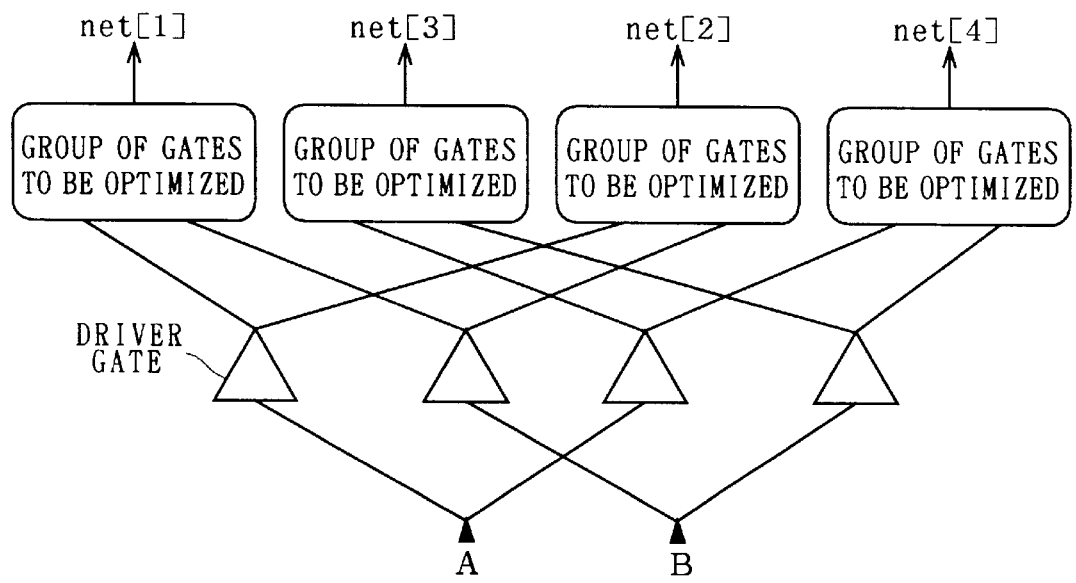

METHOD OF OPTIMIZING A LOGIC CIRCUIT

BACKGROUND OF THE INVENTION

1. Field of the Invention

The present invention relates to a method of optimizing a logic circuit for achieving optimal connection of driver gates, and more particularly to a method of optimizing a logic circuit to ensure reduction in total length of interconnections, delay and routing area of an LSI.

2. Description of the Background Art

A buffer tree refers to a logic circuit in which positive-logic and inverted-logic driver gates are connected like a tree shown in FIG. 13. In the buffer tree, an output signal from a gate is input to a plurality of other gates. Therefore, the buffer tree is added to the output of a gate in such a logic circuit as can not be driven by the driving capability of a single gate. Many logic circuits in data-bus system with a large bit width need the buffer tree.

Many logic circuits in data-bus system have symmetric circuit configurations. Effective utilization of this symmetric configuration allows a layout with a small routing area and high gate utilization. For higher gate utilization, it is needed to construct the buffer trees to be in a symmetrical relation.

A logic synthesis tool receives a logic description and automatically synthesizes a logic circuit in correspondence with the logic description. If the input logic description has a symmetry in logic structure, the synthesized logic circuit normally has a symmetry. The buffer tree, however, is a logic circuit to be added to honor the restrictions on the number of fanouts and driving capability and hence is unrelated to the logic structure of the whole circuit. The logic synthesis tool applies the buffer tree to the circuit without taking the symmetry in logic structure of the whole circuit into account. Therefore, some eventually-obtained logic circuit with the buffer tree loses the symmetry.

Discussion will be presented taking a logic circuit having symmetric logic structures shown in FIG. 14 as an example. Square blocks shown in FIG. 14 represent gates. Logic structures GX' (X=0, 1, 2, 3) are in a symmetrical relation with one another. Names in the blocks (SEL, FF) denote the kinds of gates. Names under the blocks (UX, FX) are gate names for distinguishing the gates. Solid lines represent interconnections which connect the gates. Names near the contacts between the interconnections and the blocks (A, B, S, Y of SEL and D, CL, Q of FF) denote pins of the gates. Arrowheads on the left and right sides represent input and output pins, and names near the arrowheads (clk, sel, a[X], b[X], y[X]) are input/output pin names.

Now discussed will be a case of addition of buffer trees in a balance-tree shape using two positive-logic driver gates BX to the input pins sel and clk of the logic circuit of FIG. 14. FIG. 15 illustrates an exemplary addition of buffer trees in a symmetrical relation. FIG. 16 illustrates an exemplary addition of buffer trees out of a symmetrical relation. The logic synthesis tool synthesizes either of the logic circuits of FIGS. 15 and 16 based on judgment that both logic circuits of FIGS. 15 and 16 output the same result. Names shown in FIGS. 15 and 16 correspond to those in FIG. 14.

A difference between the two logic circuits of FIGS. 15 and 16 is found after placement. FIGS. 17 and 18 illustrate layouts after placement of the logic circuits of FIGS. 15 and 16, respectively. The logic circuits shown herein are optimally placed by the Min-Cut method which is an ordinary method of placement algorithm. In the Min-Cut method, the placement is evaluated by the total number of interconnections crossing cut lines. Heavy lines of FIGS. 17 and 18 represent the cut lines. The number of interconnections crossing a cut line is shown on the underside or rightside of the cut line. The total number of interconnections crossing the cut lines in the logic circuit of FIG. 17 is thirty-two and that of FIG. 18 is thirty-four. The logic circuit of FIG. 17 has better placement result. Only the interconnections between the gates B0, B2 and the gates U1, U2 contribute to the difference between the two placement results. The interconnections between these gates do not cross the center cut line in a horizontal direction in FIG. 17, while those in FIG. 18 do. More interconnections crossing a cut line result in congested channels near the cut line, and that makes it difficult to compact the routing area by compaction function of a layout tool. As can be seen from FIGS. 17 and 18, the routing of FIG. 18 is more complicate and the total length of interconnections of FIG. 18 is longer. An increase in total length of interconnections results in an increase in delay.

Thus, since the logic synthesis tool performs addition of the buffer trees without taking the symmetry in logic structure into account, it may disadvantageously result in an increase in total length of interconnections, routing area and delay in the circuit after placement. One of the methods relating to restructuring of buffer trees is shown in "Routability-Driven Fanout Optimization" (Proc. of 30th DAC, pp. 230–235). In the logic synthesis using this method, placement of logic circuits is made before addition of buffer trees and optimization of the buffer trees is performed in accordance with the placement result. However, the buffer trees are not optimized so as to be in a symmetrical relation by this method.

SUMMARY OF THE INVENTION

The present invention is directed to a method of optimizing a logic circuit having buffer trees. According to a first aspect of the present invention, the method comprises steps of: (a) detecting a symmetry in logic structure of the logic circuit; and (b) restructuring the buffer trees so as to be in a symmetrical relation on the basis of the detected symmetry.

According to a second aspect of the present invention, in the method, described above, the step (a) includes steps of (a-1) detecting buffer trees in the logic circuit; (a-2) detecting a parent gate driven directly or passing through other gates by driver gates included in the different buffer trees; (a-3) detecting a sub-circuit consisting of gates which exist on passes from the drivers in the different buffer trees detected in the step (a-1) to the parent gate detected in the step (a-2); and (a-4) detecting the symmetry of logic structures of a plurality of the sub-circuit detected in the step (a-3) by regarding the logic structure identical in configuration if the driver gates included in the same buffer tree are regarded identical and the gates of the same kind other than the driver gates in the sub-circuit are regarded identical, and the step (b) includes a step of (b-1) exchanging the driver gates in the logic structures having the symmetry detected in the step (a-4) so that the logic structures become identical in configuration only if the gates of the same kind other than the driver gates are regarded identical.

According to a third aspect of the present invention, the method described above further comprises a step of: obtaining the same delay in the logic circuit before and after restructuring of the buffer trees.

According to a fourth aspect of the present invention, only the driver gates on the same stage from roots of the buffer trees are exchanged in the step (b-1).

According to a fifth aspect of the present invention, the driver gates on the same stage from roots of the buffer trees and having the same number of fanouts are exchanged in the step (b-1).

According to a sixth aspect of the present invention, the gates of the same kind in the step (a-4) include a gate having a logical symmetry.

According to a seventh aspect of the present invention, the gate having the logical symmetry has a plurality of inputs and its logic is not changed by exchanging connections of the plurality of inputs.

According to an eighth aspect of the present invention, the method further comprises a step of: developing a compound logic gate into the gates of which logics are not changed by exchanging connections of the plurality of inputs thereof if the compound logic gate is included in the logic structure.

According to a ninth aspect of the present invention, the step (b) further includes a step of placing the logic structures in a predetermined order.

According to a tenth aspect of the present invention, the method is incorporated in a logic synthesis tool which receives a logic description and synthesizes the logic circuit in correspondence with the logic description, so as to use a circuit information in the logic synthesis tool.

By the method of the first aspect, the buffer trees are restructured so as to be in a symmetrical relation. That produces an effect of providing a layout after placement with smaller routing area, shorter total interconnection length and shorter delay.

The method of the second aspect produces an effect of providing the buffer trees in a symmetrical relation.

By the method of the third aspect, the same delay is obtained in the logic circuit before and after optimization. That produces an effect of providing a logic circuit which has the same delay time as that of the logic circuit immediately after the logic synthesis.

In the method of the fourth aspect, the same delay is obtained in the logic circuit before and after optimization by exchanging only the driver gates on the same stage from the roots of the buffer trees. That produces an effect of providing a logic circuit which has the same delay time as that of the logic circuit immediately after the logic synthesis.

In the method of the fifth aspect, the same delay is obtained in the logic circuit before and after optimization by exchanging only the driver gates on the same stage from the roots of the buffer trees and having the same number of fanouts. That produces an effect of providing a logic circuit which has the same delay time as that of the logic circuit immediately after the logic synthesis.

The method of the sixth aspect increases the number of logic structures to be regarded identical in configuration, thereby enhancing the optimization capability.

The method of the seventh aspect increases the number of logic structures to be regarded identical in configuration since the gates are regarded identical even if they use different input pins, thereby enhancing the optimization capability.

The method of the eighth aspect increases the number of logic structures to be regarded identical in configuration since the gates are regarded identical even if they use different input pins after developing the compound logic gate into the gates of which logics are not changed by exchanging the connections of their plurality of inputs, thereby enhancing the optimization capability.

The method of the ninth aspect allows the restructuring of the buffer trees taking the positions of the input/output pins into account by placing the logic structures in the predetermined order.

The method of the tenth aspect, which is incorporated in the logic synthesis tool, eliminates the need for the step of inputting the logic circuit, and hence ensures a simpler and higher-speed processing.

Accordingly, an object of the present invention is to provide the method of optimizing a logic circuit for achieving reduction in routing area, total length of interconnections and delay of the layout after placement.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a structural diagram of buffer trees taking a bit order into account in accordance with a fifth preferred embodiment of the present invention;

FIG. 10 is a structural diagram of buffer trees without taking a bit order into account in accordance with the fifth preferred embodiment of the present invention;

DESCRIPTION OF THE PREFERRED EMB0DIMENTS

The First Preferred Embodiment

Figure 1:
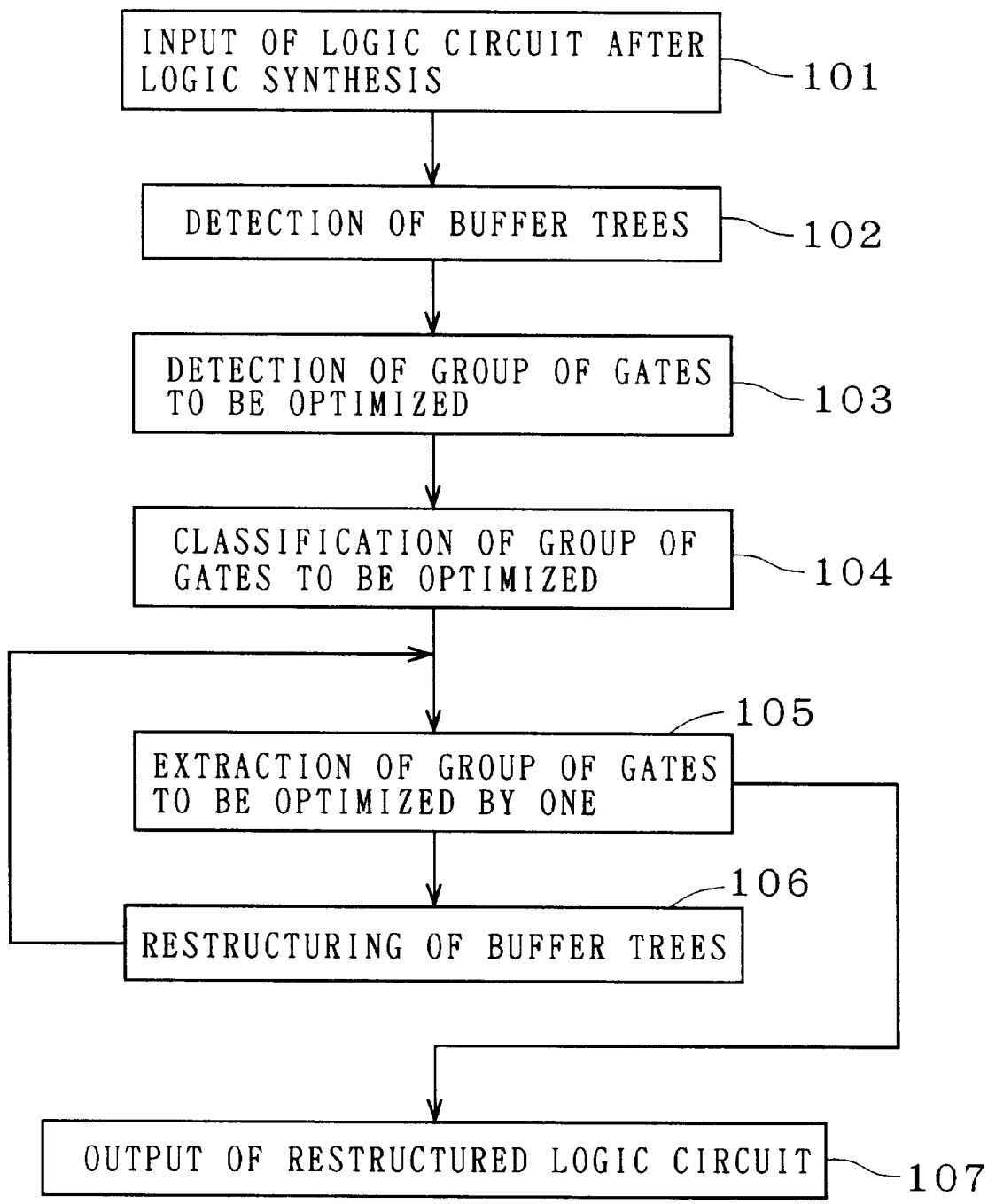
FIG. 1 is a flow chart showing a method of optimizing a logic circuit in accordance with a first preferred embodiment of the present invention.

FIG. 1 is a flow chart showing a method of optimizing a logic circuit in accordance with the first preferred embodiment of the present invention. In this preferred embodiment, optimization of the logic circuit is implemented through detection of a symmetry in logic structure of the logic circuit after logic synthesis which has buffer trees added by a logic synthesis tool and optimal restructuring of the buffer trees so as to be in a symmetrical relation on the basis of the detected symmetry. Detailed discussion of a process of the flow chart will be presented below with reference to the circuit of FIG. 16 taken as an example of the logic circuit after logic synthesis.

In Step 101, the logic circuit after logic synthesis which has the buffer trees added by the logic synthesis tool is inputted. A description format of the inputted logic circuit expresses a net list of logic circuit, such as VerilogHDL or VHDL.

In Step 102, a plurality of different buffer trees are detected in the inputted logic circuit. The detection of buffer trees is implemented using a well-known technique. Subsequently, driver gates in each of the detected buffer trees are detected to make a set of the detected driver gates BTj. In a buffer tree using inverted-logic gates, the logical polarity of the odd stages from a root of the buffer tree and that of even stages are in an inverse relation to each other. Therefore, the odd stages and the even stages are regarded different and are separated into different sets BTj which are independent from each other. If the buffer tree includes a driver gate of which the output has both positive logic and inverted logic or includes both a positive-logic driver gate and an inverted-logic driver gate, the buffer tree is separated according to the polarity to make different sets BTj independent from each other. The circuit of FIG. 16 has a buffer tree whose root is an input pin sel and a buffer tree whose root is an input pin clk. Respective sets BTj of driver gates included in the two buffer trees are BTsel={B0, B2} and BTclk={B1, B3}. BTsel and BTclk are set names with respect to these buffer trees.

In Step 103 detected is a set of gates relating to a plurality of buffer trees, which is termed a group of gates to be optimized. This step will be discussed in detail. First detected is a gate which can reach more than one driver gate included in different buffer trees in tracing of connection from all the input pins of the gate in a fanin direction. A set of gates existing on passes from the gate which can reach more than one buffer tree, which is termed a parent gate, to the driver gates in the different buffer trees is termed a group of gates to be optimized. Optimization of the buffer trees is performed in units of group of gates to be optimized. In searching the group of gates to be optimized, further tracing should not be made on from a parent gate of another group of gates to be optimized in a fanin direction. Through the above detection process with respect to all the gates in a net list, all groups of gates to be optimized are obtained. No gate is included in more than one group of gates to be optimized, except the driver gate in the buffer tree. The circuit of FIG. 16 has four groups of gates to be optimized, {F0, U0, B0, B1}, {F1, U1, B2, B1}, {F2, U2, B0, B3} and {F3, U3, B2 B3}. In each of the four groups of gates to be optimized, the first gate is the parent gate and the last two are the driver gates in the buffer trees.

In Step 104, the groups of gates to be optimized are classified according to the symmetry in logic structure consisting of the gates included in a group of gates to be optimized (logic structure of the group of gates to be optimized). The symmetry in logic structure can be detected by the following method. To begin with, a logic structure graph satisfying the following four conditions is made with respect to each of the groups of gates to be optimized.

(Condition 1) The logic structure graph should have nodes in a one-to-one correspondence with the gates in the group of gates to be optimized.

(Condition 2) Nodes in correspondence with driver gates included in the buffer trees each should have a tag of buffer-tree name and other nodes each should have a tag of name representing the kind of gate. This means that driver gates included in a buffer tree are regarded as identical, and gates of the same kind, other than the driver gates, are regarded as identical.

(Condition 3) The logic structure graph should have arcs in correspondence with connections between the gates in the group.

(Condition 4) The arcs each should have a tag of pin names for the input and output in the connection.

Figure 2:
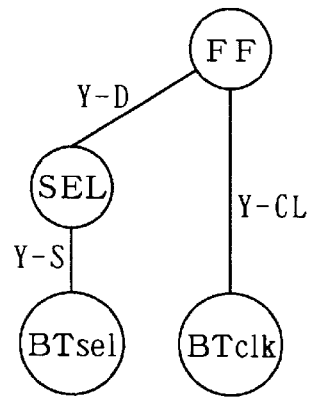
FIG. 2 illustrates an exemplary logic structure graph of a group of gates to be optimized.
Figure 14:
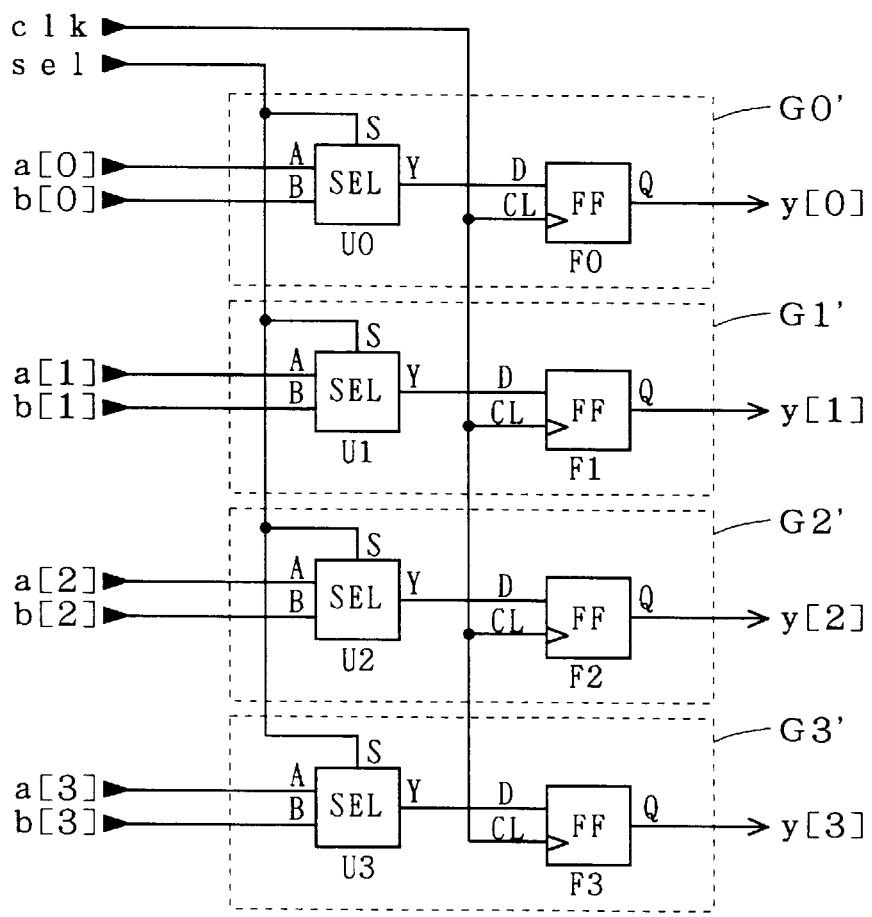
FIG. 14 illustrates an example of the logic circuit having a symmetric logic structure.
Figure 16:
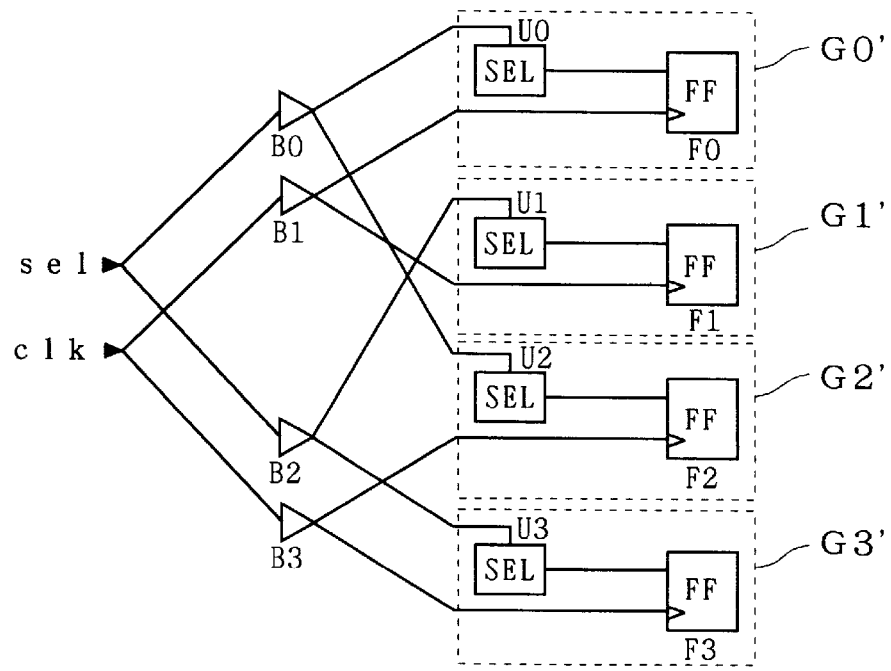
FIG. 16 is a circuit diagram of an exemplary logic circuit with buffer trees out of the symmetrical relation.
Figure 17:
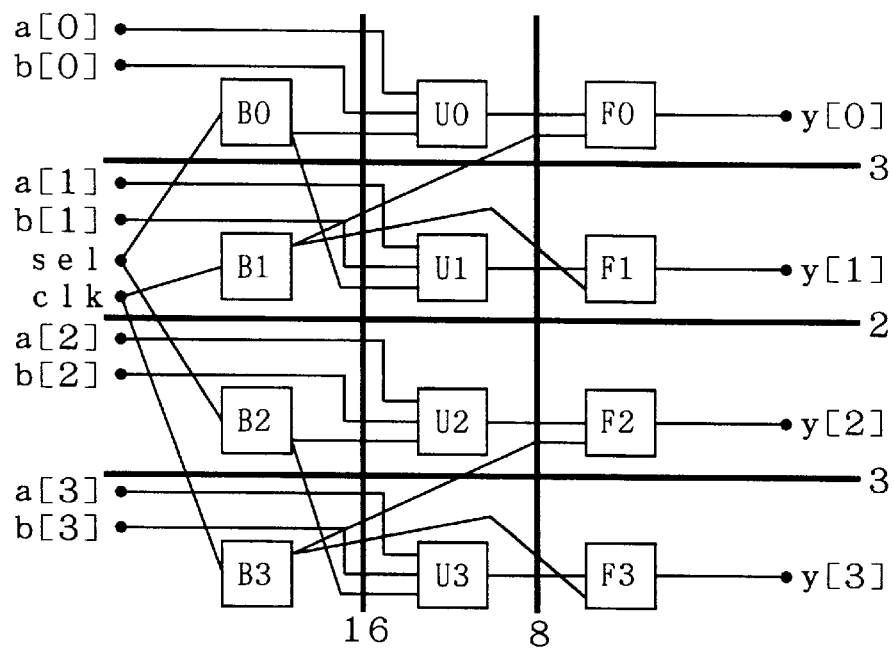
FIG. 17 is a circuit diagram of the logic circuit of FIG. 15 after optimal placement.
Figure 18:
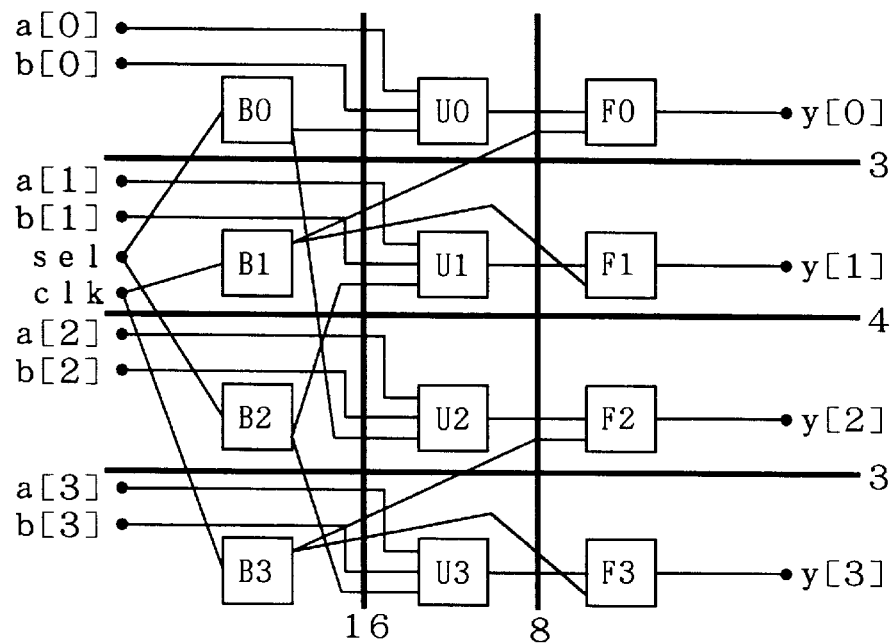
FIG. 18 is a circuit diagram of the logic circuit of FIG. 16 after optimal placement.

FIG. 2 illustrates a logic structure graph of a group of gates to be optimized shown in FIG. 16. In FIG. 2, Y-CL, Y-D and Y-S represent arcs and Y, CL, D and S correspond to the pin names of FIG. 14. The four groups of gates to be optimized in FIG. 16 are represented by identical logic structure graph (including the tags) in configuration. The groups of gates to be optimized of which the logic structures are identical in configuration are symmetric in logic structure. Therefore, classification of the groups of gates to be optimized according to the symmetry in logic structure can be made depending on whether the logic structure graphs are identical in configuration or not. Since the four groups of gates to be optimized are represented by identical logic structure graph, these groups are classified into one grouping. Thus, by detecting a plurality of logic structure graphs which are identical in configuration, the symmetry in logic structure can be found.

In Step 105, one of the groups of gates to be optimized which are classified in Step 104 is extracted for Step 106. Completion of Step 106 for all the classified groups is followed by Step 107.

In Step 106, the buffer trees are restructured so as to be in a symmetrical relation of logic structure. How to restructure the buffer trees will be discussed below in detail. In the logic structure graph, the node corresponding to the driver gate of the buffer tree has a tag indicating the buffer-tree name. A graph in which the node has a tag indicating the gate name, instead of the buffer-tree name, is termed a real structure graph. In other words, in the real structure graph, the gates of the same kind other than the driver gates are regarded identical in the groups of gates to be optimized which are identical in configuration. The real structure graphs for groups having different driver gates are not identical in configuration, even if the logic structure graphs therefor are identical in configuration, i.e., have the symmetry. The driver gates in a buffer tree are exchangeable between the groups of gates to be optimized which have identical logic structure graph without changing the logic in a logic circuit. By exchanging the driver gates to obtain the identical real structure graph, the number of different real structure graphs is reduced. Restructuring of the buffer trees is achieved through minimizing the number of different real structure graphs. The minimization is achieved through exchanging the driver gates in all the combinations of real structure graphs, for example.

Figure 3:
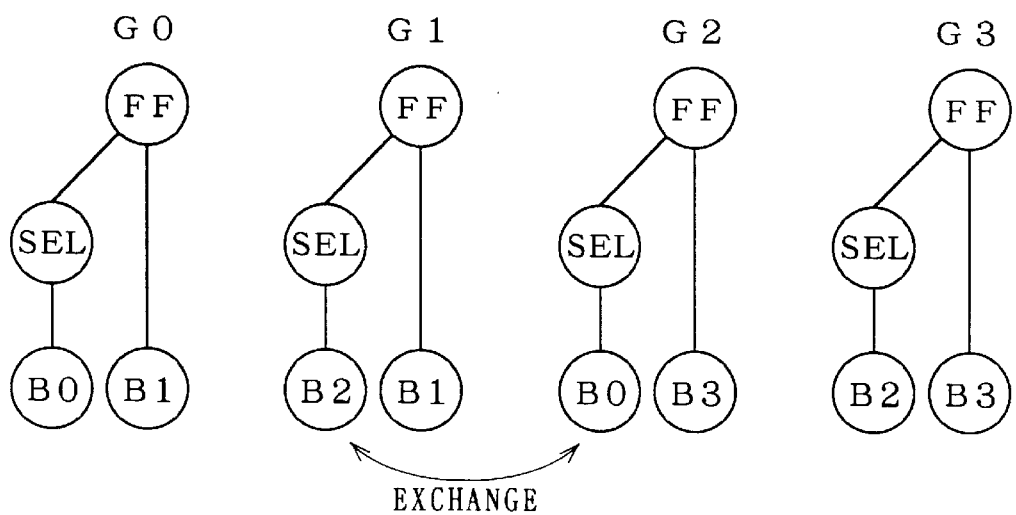
FIG. 3 illustrates an exemplary real structure graph of a group of gates to be optimized.
Figure 15:
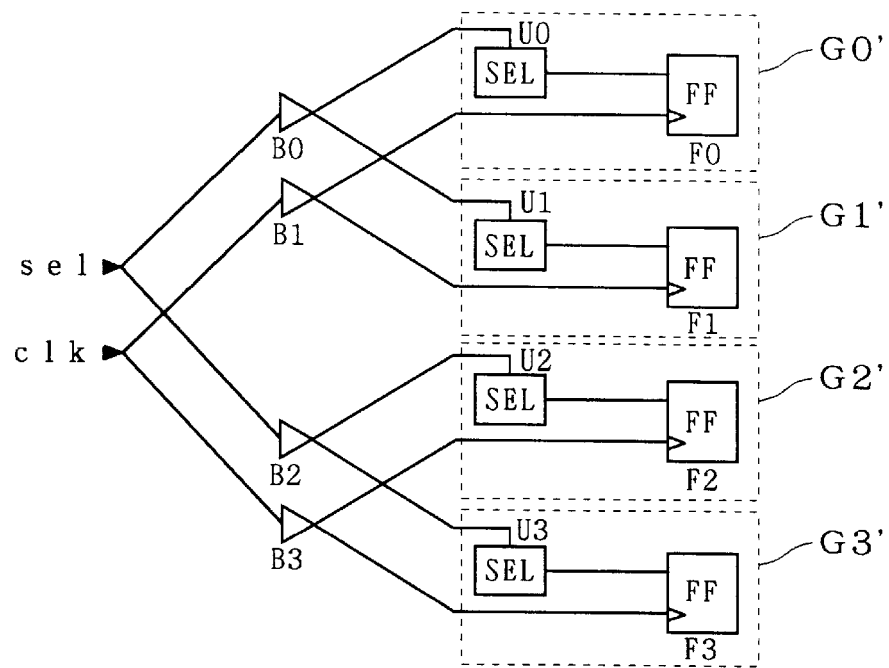
FIG. 15 is a circuit diagram of an exemplary logic circuit with buffer trees in a symmetrical relation.

FIG. 3 shows the real structure graphs for four groups of gates to be optimized of FIG. 16. The real structure graphs G0, G1, G2 and G3 of FIG. 3 correspond to the sub-circuits G0', G1', G2' and G3' of FIG. 16, respectively. These real structure graphs are different from one another. Now, the driver gate B2 in the real structure graph G1 is exchanged with the driver gate B0 in the real structure graph G2. Then, the real structure graphs G0 and G1, and G2 and G3 become identical in configuration. Further exchange produces no reduction in the number of different real structure graphs. Therefore, the minimum number of different real structure graphs is two. The real structure graphs G0, G1, G2 and G3 after this exchange correspond to the sub-circuits G0', G1', G2' and G3' of FIG. 15, respectively.

In Step 107, the logic circuit after restructuring is outputted in the same format as the logic circuit after logic synthesis inputted in Step 101. Performing optimization of the logic circuit of FIG. 16 by the method of the present invention provides the logic circuit of FIG. 15.

Through the above process, the optimization of buffer trees is accomplished so that the buffer trees may be in a symmetrical relation of logic structure, thereby ensuring reduction in routing area, total length of interconnections and delay of the layout in the logic circuit after optimization.

The Second Preferred Embodiment

In the first preferred embodiment, there may be a case where the logic circuit after logic synthesis inputted in Step 101 and that after optimization having the restructured buffer trees obtained in Step 107 have different delays. The second preferred embodiment is intended to obtain the same delay in the logic circuit before and after restructuring.

Figure 4:
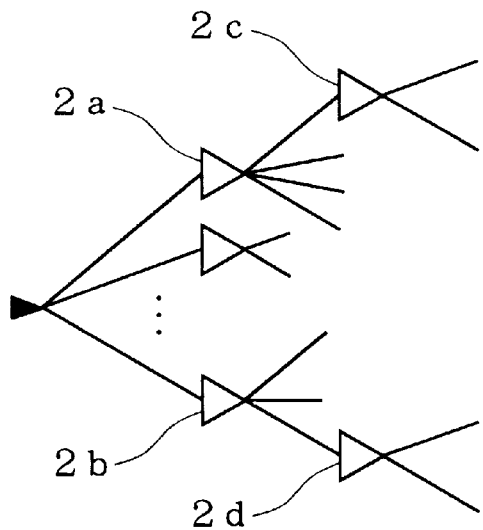
FIG. 4 illustrates an exchange of gates without changing delay in accordance with a second preferred embodiment of the present invention.

In FIG. 4, a driver gate 2a is on the first logic stag e from a root of a buffer tree and has four fanouts, a driver gate 2b is on the first logic stage from the root and has three fanouts, a driver gate 2c is on the second logic stage from the root and has two fanouts and a driver gate 2d is on the second logic stage from the root and has two fanouts. In the exchange of driver gates of Step 106 of the first preferred embodiment, if the driver gates to be exchanged are on the different logic stages or have different number of fanouts, the delay of the logic circuit after restructuring is different from that after logic synthesis. In order to obtain the same delay both in the logic circuit after logic synthesis and in that after optimization of buffer trees, such restriction as below is imposed when the driver gates are exchanged. If the delay is measured by the number of logic stages, only the driver gates on the same logic stage can be exchanged. In FIG. 4, honoring this restriction, the driver gates 2a and 2b can be exchanged and the driver gates 2c and 2d can be exchanged in Step 106. If the delay is calculated from the interconnection capacity which is obtained from the input load capacities of the gates connected to the driver gate and the number of fanouts, only the driver gates on the same logic stage and having the same number of fanouts can be exchanged. In FIG. 4, honoring this restriction, the driver gates 2c and 2d can be exchanged in Step 106.

Thus, imposing restriction on the exchange allows optimization of buffer trees without any change of delay in the logic circuit before and after restructuring of buffer trees.

The Third Preferred Embodiment

Figure 5:
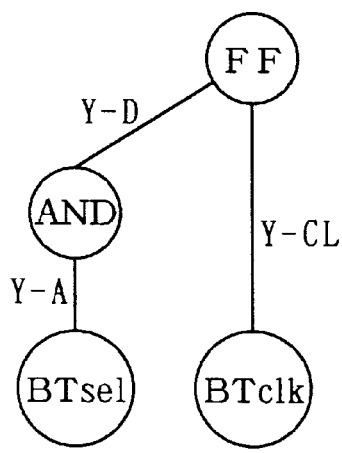
FIG. 5 illustrates an exemplary logic structure graph including a pin-exchangeable logic gate in accordance with a third preferred embodiment of the present invention.
Figure 6:
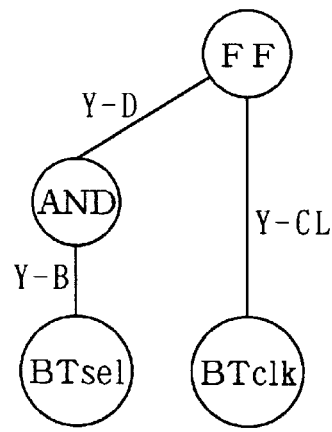
FIG. 6 illustrates an exemplary logic structure graph including a pin-exchangeable logic gate which is different in pin name from that of FIG. 5 in accordance with the third preferred embodiment of the present invention.

FIGS. 5 and 6 show exemplary logic structure graphs which are different only in the two input pins (pin names thereof are A and B) of the AND gate on the pass from each other. In Step 104 of the first preferred embodiment, the two logic structure graphs are not identical because they have different tags of pin names. In an OR gate or an And gate, however, exchanging connections of the input pins with each other would have no effect on the function of the whole logic circuit. Such logic gate is termed a pin-exchangeable logic gate.

In the third preferred embodiment, classification in Step 104 of the first preferred embodiment is performed taking the logic of the gate on the pass into account. Specifically, the logic structure graphs which are different only in the input pin of the pin-exchangeable logic gate are regarded identical. For example, in FIGS. 5 and 6, the tags Y-A and Y-B are regarded identical, and hence the logic structure graphs of FIGS. 5 and 6 are regarded identical in configuration.

Furthermore, not limited to the pin-exchangeable logic gate on the pass as discussed above, this preferred embodiment may be applied to a circuit having a logical symmetry if an exchange of connections of the gates on the pass would have no effect on its function. In Step 104 of the first preferred embodiment, the logic structure graphs with different tags of the gates are also regarded identical. A circuit having a logical symmetry includes a pin-exchangeable logic gate. The information on the pin-exchangeable logic gate is stored, for example, in a database in advance, and access is made to the database for reference in Step 104.

In this preferred embodiment, the number of logic structure graphs having the symmetry increases because the logic structure graphs having different pin names of the pin-exchangeable logic gates are regarded identical, to enhance optimizing capability.

The Fourth Preferred Embodiment

Figure 7:
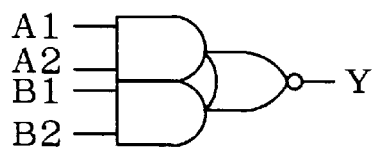
FIG. 7 is a circuit diagram of an exemplary compound logic gate in accordance with a fourth preferred embodiment of the present invention.

A compound logic gate refers to a single gate having a logic made by combination of And logic, OR logic or negative logic as shown in FIG. 7. In general, the compound logic gate is not a pin-exchangeable logic gate. Therefore, the method of the third preferred embodiment can not be applied to the compound logic gate.

Figure 8:
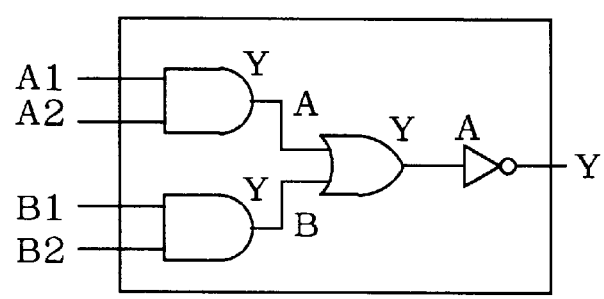
FIG. 8 is a circuit diagram of an equivalent circuit of the compound logic gate of FIG. 7, constituted of a combination of simple logic circuits.

The compound logic gate, however, can be developed into pin-exchangeable logic gates. For example, the exemplary compound logic gate of FIG. 7 can be developed into pin-exchangeable logic gates of And logic, OR logic and negative logic shown in FIG. 8. Accordingly, for example, by developing the compound logic gate into pin-exchangeable logic gates in or before Step 104 of the first preferred embodiment, the method of the third preferred embodiment can be applied to the compound logic gate. The information on the compound logic gate and the pin-exchangeable logic gates is stored, for example, in a database in advance, and access is made to the database for reference when the compound logic gate is developed into pin-exchangeable logic gates in or before Step 104.

In this preferred embodiment, the number of logic structure graphs having the symmetry increases through developing the compound logic gate into the pin-exchangeable logic gates, to enhance optimizing capability.

The Fifth Preferred Embodiment

FIGS. 9 and 10 illustrate two types of configurations of buffer trees in a logic circuit having groups of gates to be optimized relating to data distribution of four-bit width. In FIGS. 9 and 10, for convenience of description, the four driver gates included in the four groups of gates to be optimized among them are shown. The configurations of FIGS. 9 and 10 would be identical if the groups of gates to be optimized having outputs net[2] and net[3] are exchanged in position. The optimization is performed through minimizing the number of the different real logic structures in Step 106 of the first preferred embodiment. This optimization may provide the configuration of FIG. 10.

The positions of the input/output pins are generally fixed in an actual placement of LSI. The input/output pins having a bit width are normally placed in the order of bit. Taking the positions of the input/output pins into account, a difference arises in complexity of interconnections between a plurality of gates in the group to be optimized. For example, an interconnection between the group of gates to be optimized having the output net [2] and the driver gate and that between the group of gates to be optimized having the output net [3] and the driver gate are crossed in FIG. 10, but not crossed in FIG. 9. Hence, the logic circuit of FIG. 10 is more complex than that of FIG. 9.

In the fifth preferred embodiment, the groups of gates to be optimized are placed in a predetermined order of bit corresponding thereto in order to avoid complex routing when the positions of the input/output pins are taken into account. A process of placing the groups of gates to be optimized in the predetermined order of bit will be discussed below. The information on the logic circuit having a bit width is obtained from pin names or interconnection names of the logic circuit. For example, in the logic circuits of FIGS. 9 and 10, the output interconnections of the groups of gates to be optimized have names net[1], net[2], net[3] and net[4]. These names teach that these are groups of gates to be optimized relating to the data distribution interconnections with a bit width. The bit order is determined in advance as net[1], net[2], net[3] and net[4]. Referring to these names, the groups of gates to be optimized are placed in the order of bit. The placement of the groups of gates to be optimized in the predetermined order of bit is performed in Step 106.

Thus, since the buffer trees shown in FIGS. 9 and 10 are constructed according to the predetermined order of bit in Step 106 of the first preferred embodiment, the restructuring of the buffer trees is achieved taking the positions of the input/output pins into account.

The Sixth Preferred Embodiment

Figure 11:
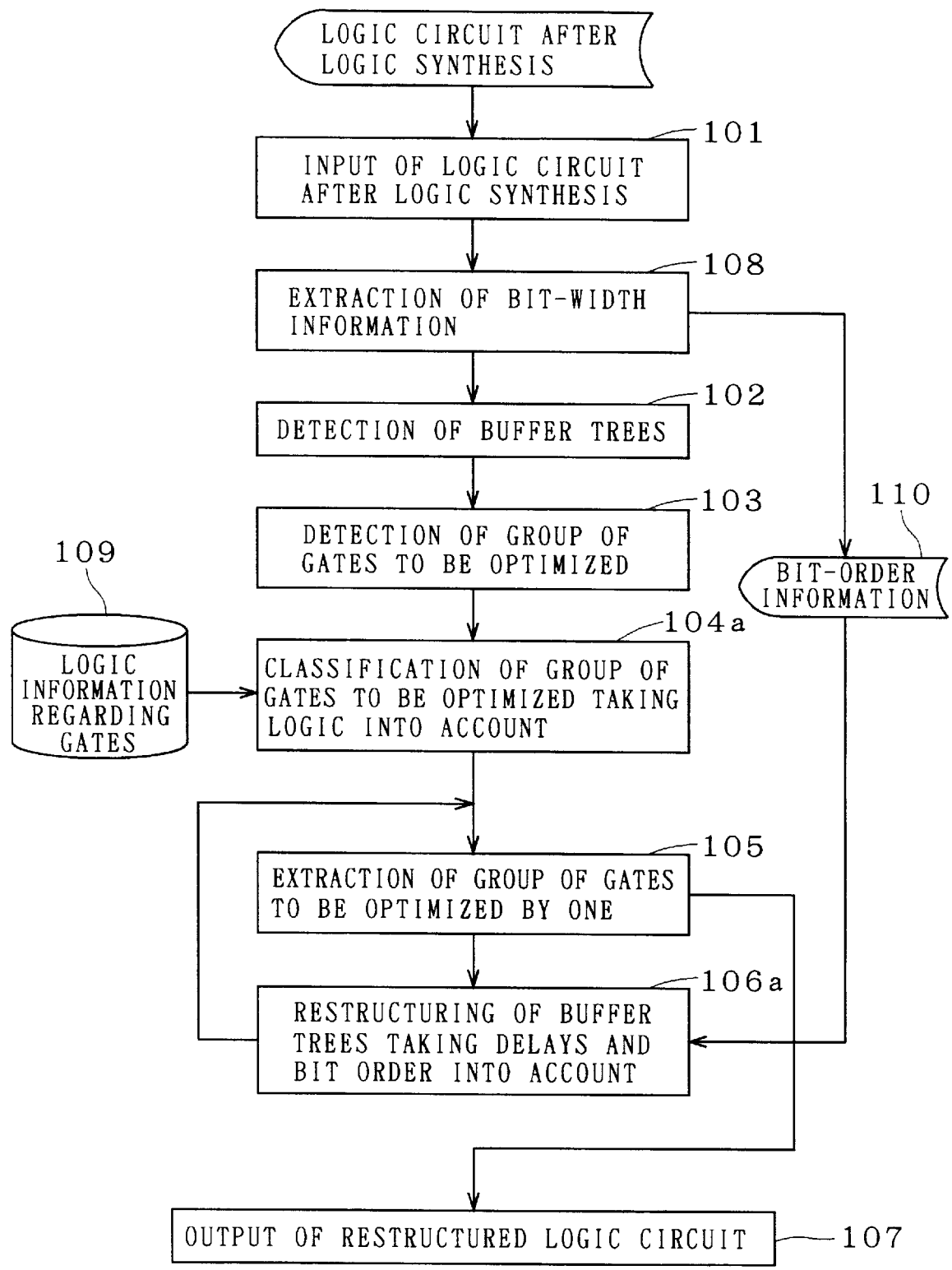
FIG. 11 is a flow chart showing a method of optimizing the logic circuit in accordance with a sixth preferred embodiment of the present invention.

FIG. 11 is a flow chart showing a method of optimizing the logic circuit in accordance with a sixth preferred embodiment for performing all the functions of the first to fifth preferred embodiments. The flow chart of FIG. 11 is mainly the same as that of FIG. 1.

First, Step 106 is replaced by Step 106a to achieve the second preferred embodiment. In Step 106a, the restriction on the exchange of the driver gates is added to Step 106 in order to obtain the same delay of the logic circuit before and after restructuring of the buffer trees.

Second, Step 104 of FIG. 1 is replaced by Step 104a of classifying the groups of gates to be optimized, taking the logic into account, through developing the compound logic gate into pin-exchangeable logic gates, to achieve the third and fourth preferred embodiments. In Step 104a, for checking the logic of the gate on the pass, access is made to a database 109 which stores logic information relating to pin-exchangeable logic gates and the like.

Third, Step 108 of extracting bit-width information 110 including bit order of distribution interconnections and the like from a logic circuit is added and a step of restructuring the buffer trees taking the bit order into account is added to Step 106a, to achieve the fifth preferred embodiment. Other reference characters of FIG. 11 correspond to those of FIG. 1.

Thus, by replacing Steps 104 and 106 by Steps 104a and 106a, respectively, and adding Step 108 and the step of making access to the database 109 to Steps of FIG. 1, the method of optimizing the logic circuit to perform all the functions of the first to fifth preferred embodiments is obtained.

The Seventh Preferred Embodiment

In the first to sixth preferred embodiments, the logic circuit after logic synthesis which has the buffer trees added by the logic synthesis tool is inputted in Step 101 and the optimization of the buffer trees is performed. The method of this optimization may be incorporated in the logic synthesis tool.

Figure 19:
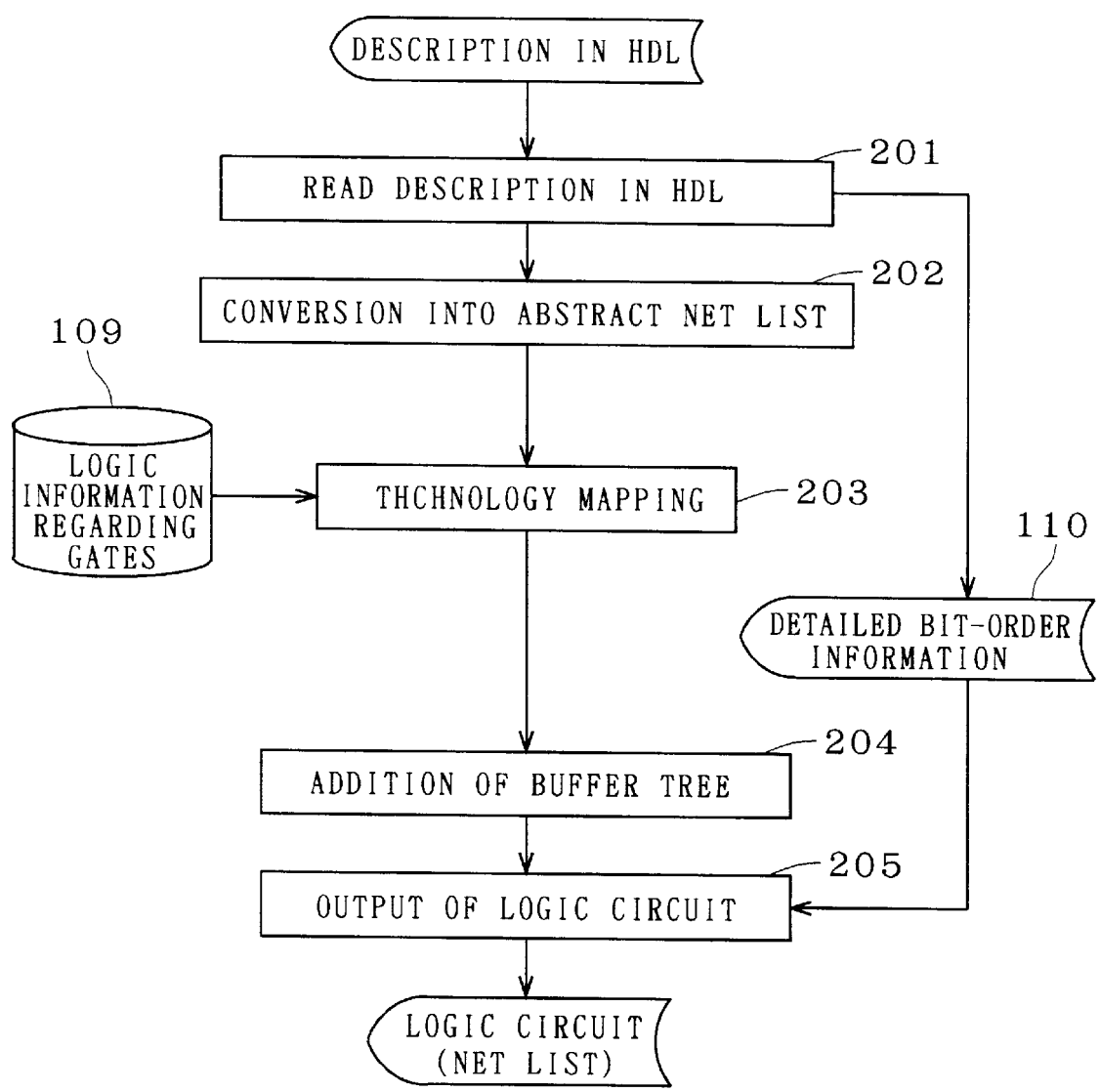
FIG. 19 is a flow chart showing the algorithm of an operation of the logic synthesis tool.

FIG. 19 is a flow chart showing the algorithm of an operation of the logic synthesis tool. In the algorithm, a description in HDL (Hardware Description Language) is inputted and a logic circuit is outputted. Specifically discussing as to the internal flow, first in Step 201, the description in HDL is read into the tool. In Step 202, a logic is extracted from the description in HDL and converted into an abstract net list. In Step 203, access is made to the database 109 storing logic information of gates such as pin-exchangeable logic gates and a virtual cell of the abstract net list converted in Step 202 is mapped to a real cell. In Step 204, a buffer tree is added to the mapped net list. In Step 205, an eventually-synthesized logic circuit is outputted from the net list with the buffer tree. Through Step 201, a detailed information 110 regarding the bit order is obtained. Part of the bit-order information 110 is used in Step 205 to name the nets and cells. Furthermore, the detailed bit-order information 110 and the logic information regarding gates, such as pin-exchangeable logic gates, stored in the database 109 are included in circuit information of the logic synthesis tool.

Figure 12:
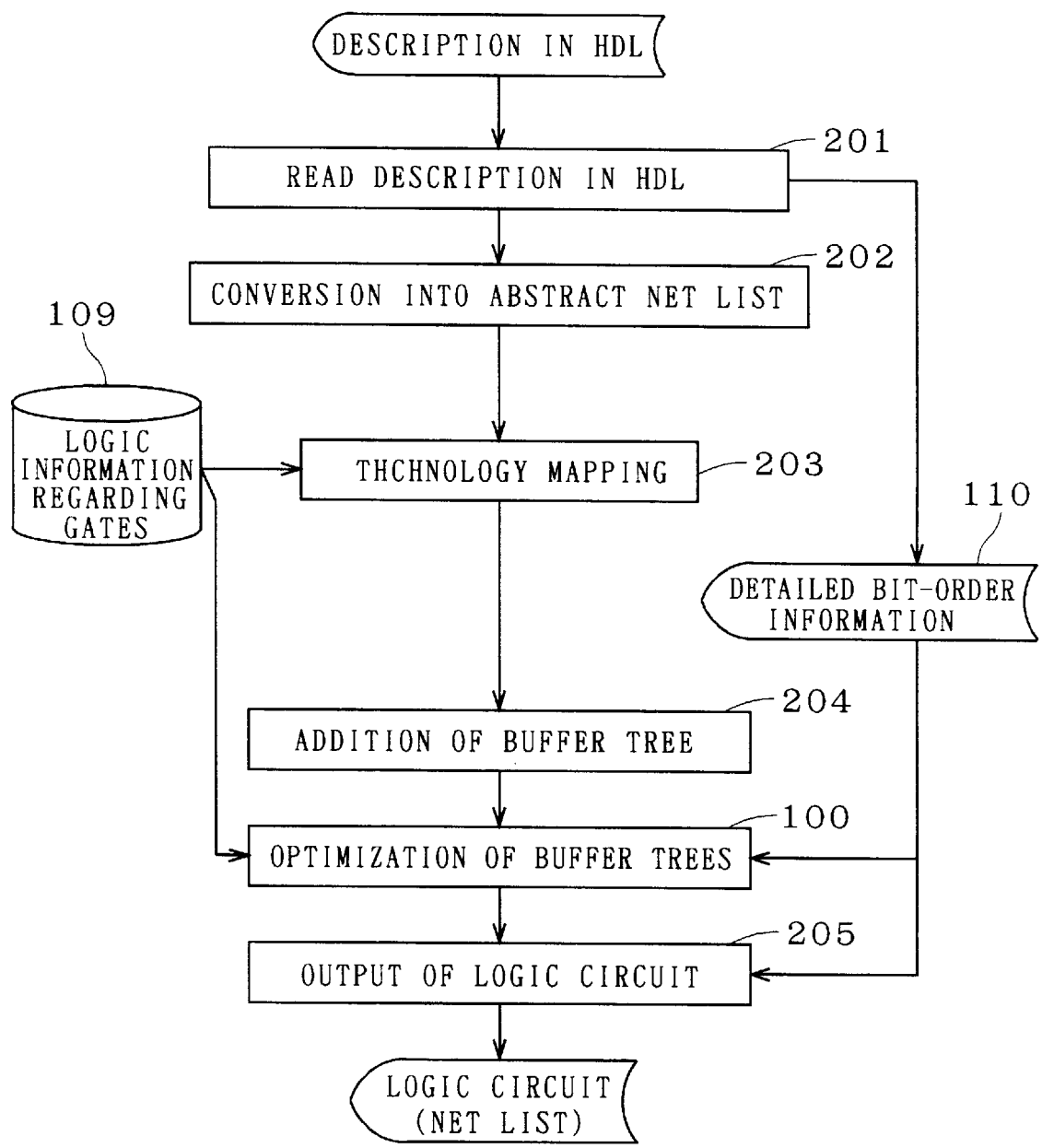
FIG. 12 is a flow chart showing a method of optimizing the logic circuit which is incorporated in a logic synthesis tool in accordance with a seventh preferred embodiment of the present invention.
Figure 13:
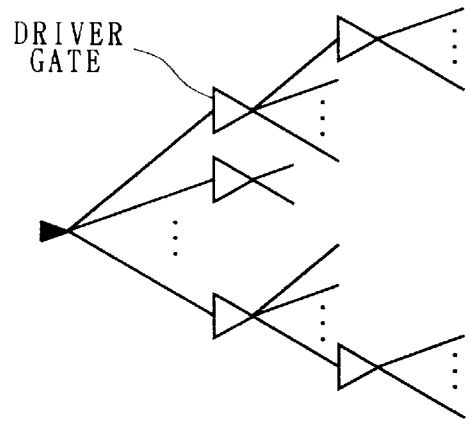
FIG. 13 illustrates an example of the buffer tree.

FIG. 12 is a flow chart showing a method of optimizing the logic circuit incorporated in the logic synthesis tool in accordance with the seventh preferred embodiment, where the optimization process (Step 100) for buffer trees of the first to sixth preferred embodiments is incorporated in the flow of the operation of the logic synthesis tool shown in FIG. 19. Step 100 corresponds to the flows of FIGS. 1 and 11. Incorporating the process (Step 100) into the algorithm of operation of the logic synthesis tool allows sharing of the database 109 storing the logic information regarding gates and the bit-order information 110. Step 100 does not include Step 101.

Thus, incorporating the optimization step for buffer trees into the logic synthesis tool eliminates the need for the step of inputting the logic circuit after logic synthesis (Step 101) as discussed in the first to sixth preferred embodiments and ensures a simpler and higher-speed processing. Moreover, since the logic synthesis tool has the logic information regarding gates, there is no need for another input of the logic information regarding gates to achieve the third and fourth preferred embodiments. The information regarding data distribution interconnection with a bit width in the fifth preferred embodiment can be also obtained more easily.

While the invention has been shown and described in detail, the foregoing description is in all aspects illustrative and not restrictive. It is therefore understood that numerous modifications and variations can be devised without departing from the scope of the invention.

I claim:

1. A method of optimizing a logic circuit having a plurality of first buffer trees, comprising steps of:
   (a) detecting a symmetry in logic structure of said logic circuit, said symmetry consisting of said plurality of first buffer trees and a plurality of sub-circuits connected respectively to said plurality of first buffer trees, each of said plurality of sub-circuits being connected to all of said plurality of first buffer trees; and (b) restructuring said plurality of first buffer trees so as to be in a symmetrical relation on the basis of said detected symmetry by exchanging connections of said plurality of sub-circuits to said plurality of first buffer trees to form a plurality of second buffer trees, said plurality of second buffer trees having configuration identical to said plurality of first buffer trees.

2. The method of claim 1, wherein said step (a) includes steps of
- (a-1) detecting said plurality of first buffer trees in said logic circuit;
- (a-2) detecting a plurality of parent gates driven based on said plurality of first buffer trees;
- (a-3) detecting a plurality of groups of gates which exist on passes from said plurality of parent gates to a plurality of first roots of said plurality of first buffer trees, wherein each one of said plurality of groups includes at least one gate other than a driver gate of one of said plurality of first buffer trees; and
- (a-4) detecting said symmetry of logic structure, wherein said symmetry of logic structure consists of a plurality of graphs, said plurality of graphs including at least one of said plurality of groups, said at least one of said plurality of groups consisting of a plurality of gates, each one of said plurality of gates having identical features with each other one of said plurality of gates, and said step (b) includes a step of
- (b-1) exchanging driver gates between at least two of said plurality of graphs so that driver gates of said at least two of said plurality of graphs and driver gates of graphs other than said at least two of said plurality of graphs become identical, to exchange said plurality of first buffer trees for said plurality of second buffer trees.

3. The method of claim 1, further comprising a step of:
obtaining a same delay in said logic circuit before and after said step (b).

4. The method of claim 2, wherein
only said driver gates on the same stage from said roots of said buffer trees are exchanged in said step (b-1).

5. The method of claim 2, wherein
only driver gates on a same stage from said plurality of first roots of said plurality of first buffer trees and a plurality of second roots of said plurality of second buffer trees and having an equal number of fanouts are exchanged in said step (b-1).

6. The method of claim 2, wherein
said plurality of gates having identical features with each other one of said plurality of gates in said step (a-4) include a gate having a logical symmetry.

7. The method of claim 6, wherein
said gate having said logical symmetry has a plurality of inputs and logic of said gate remains unchanged by exchanging connections of said plurality of inputs.

8. The method of claim 7, further comprising a step of:
developing a compound logic gate into at least one of said gate having said logical symmetry if said compound logic gate is included in said plurality of groups.

9. The method of claim 2, wherein
said step (b) further includes a step of
placing said plurality of groups in a predetermined order.

10. The method of claim 2, which is incorporated in a logic synthesis tool which receives a logic description and synthesizes said logic circuit in correspondence with said logic description, so as to use a circuit information in said logic synthesis tool.

11. A method of optimizing a logic circuit having a plurality of first buffer trees, comprising the steps of:
- (a) creating said logic circuit having said plurality of first buffer trees;
- (b) detecting a symmetry in logic structure of said logic circuit created in step (a), said symmetry consisting of said plurality of first buffer trees and a plurality of sub-circuits connected respectively to said plurality of first buffer trees, each of said plurality of sub-circuits being connected to all of said plurality of first buffer trees; and
- (c) restructuring said plurality of first buffer trees so as to be in a symmetrical relation on the basis of said detected symmetry by exchanging connections of said plurality of sub-circuits to said plurality of first buffer trees to form a plurality of second buffer trees, said plurality of second buffer trees having configuration identical to said plurality of first buffer trees.

12. The method of claim 11, wherein said step (b) includes steps of
- (b-1) detecting said plurality of first buffer trees in said logic circuit;
- (b-2) detecting a parent gate driven directly or passing through other gates by a plurality of driver gates included in said plurality of first buffer trees;
- (b-3) detecting a sub-circuit consisting of at least one gate which exists on passes from said plurality of driver gates in said plurality of first buffer trees detected in said step (b-1) to said parent gate detected in said step (b-2); and
- (b-4) detecting a symmetry of logic structure of a plurality of said sub-circuit detected in said step (b-3), and said step (c) includes a step of
- (c-1) exchanging a first group of said plurality of driver gates in said plurality of said sub-circuit having said symmetry detected in said step (b-4).

13. The method of claim 11, further comprising a step of:
obtaining a same delay in said logic circuit before and after said step (c).

14. The method according to claim 12, wherein
only driver gates on the same stage from roots of said plurality of first buffer trees are exchanged in said step (c-1).

15. The method of claim 11, wherein said step (b) further comprises
detecting a symmetry in logic structure of said logic circuit using at least one logic structure graph.

16. The method of claim 12, wherein
only driver gates on the same stage from roots of said plurality of first buffer trees and having an equal number of fanouts are exchanged in said step (c-1).

17. The method according to claim 12, wherein
said step (c) further includes a step of
placing said plurality of said sub-circuit in a predetermined order.

18. The method according to claim 12, which is incorporated in a logic synthesis tool which receives a logic description and synthesizes said logic circuit in correspondence with said logic description, so as to use a circuit information in said logic synthesis tool.

* * * * *